United States Patent
Tinnemans et al.

(10) Patent No.: US 9,696,636 B2
(45) Date of Patent: *Jul. 4, 2017

(54) LITHOGRAPHIC APPARATUS, DEVICE MANUFACTURING METHOD AND COMPUTER PROGRAM

(71) Applicant: ASML Netherlands B.V., Veldhoven (NL)

(72) Inventors: Patricius Aloysius Jacobus Tinnemans, Hapert (NL); Arno Jan Bleeker, Westerhoven (NL); Erik Roelof Loopstra, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 203 days.

This patent is subject to a terminal disclaimer.

(21) Appl. No.: 14/350,327

(22) PCT Filed: Nov. 6, 2012

(86) PCT No.: PCT/EP2012/071927
§ 371 (c)(1),
(2) Date: Apr. 7, 2014

(87) PCT Pub. No.: WO2013/079285
PCT Pub. Date: Jun. 6, 2013

(65) Prior Publication Data
US 2014/0285785 A1    Sep. 25, 2014

Related U.S. Application Data

(60) Provisional application No. 61/564,642, filed on Nov. 29, 2011.

(51) Int. Cl.
G03F 7/20    (2006.01)
G03F 9/00    (2006.01)

(52) U.S. Cl.
CPC .......... *G03F 7/70558* (2013.01); *G03F 7/705* (2013.01); *G03F 7/70191* (2013.01);
(Continued)

(58) Field of Classification Search
CPC ............ G03F 7/70191; G03F 7/70291; G03F 7/70391; G03F 7/70508; G03F 7/70558;
(Continued)

(56) References Cited

U.S. PATENT DOCUMENTS 4,090,206 A    5/1978  Pfeifer
4,447,126 A    5/1984  Heidrich
(Continued)

FOREIGN PATENT DOCUMENTS

CN    1797207       7/2006
CN    100472328 C   3/2009
(Continued)

OTHER PUBLICATIONS

Taiwan Office Action dated Aug. 18, 2014 in corresponding Taiwan Patent Application No. 101143781.

(Continued)

*Primary Examiner* — Michelle M Iacoletti
(74) *Attorney, Agent, or Firm* — Pillsbury Winthrop Shaw Pittman LLP (57) ABSTRACT

The invention relates to intensity values for a plurality of beams used to irradiate a plurality of locations on a target are determined with reference to the position and/or rotation of the locations. Also provided is an associated lithographic or exposure apparatus, an associated device manufacturing method and an associated computer program.

20 Claims, 8 Drawing Sheets

(52) U.S. Cl.
CPC ...... *G03F 7/70275* (2013.01); *G03F 7/70291* (2013.01); *G03F 7/70308* (2013.01); *G03F 7/70391* (2013.01); *G03F 7/70508* (2013.01); *G03F 7/70525* (2013.01); *G03F 9/7026* (2013.01)

(58) Field of Classification Search
CPC ............... G03F 9/7026; G03F 7/70275; G03F 7/70308; G03F 7/705; G03F 7/70525
See application file for complete search history.

(56) References Cited

U.S. PATENT DOCUMENTS

| | | | |
|---|---|---|---|
| 4,520,472 | A | 5/1985 | Reno |
| 4,525,729 | A | 6/1985 | Agulnek |
| 4,640,573 | A | 2/1987 | Kataoka |
| 4,780,730 | A | 10/1988 | Dodge |
| 4,796,038 | A | 1/1989 | Allen |
| 4,844,568 | A | 7/1989 | Suzuki |
| 4,864,216 | A | 9/1989 | Kalata |
| 4,952,949 | A | 8/1990 | Uebbing |
| 5,051,762 | A | 9/1991 | Lea |
| 5,216,247 | A | 6/1993 | Wang |
| 5,216,534 | A | 6/1993 | Boardman |
| 5,229,872 | A | 7/1993 | Mumola |
| 5,296,891 | A | 3/1994 | Vogt |
| 5,457,488 | A | 10/1995 | Nakamura |
| 5,481,392 | A | 1/1996 | Damer |
| 5,523,193 | A | 6/1996 | Nelson |
| 5,568,320 | A | 10/1996 | Rees |
| 5,589,973 | A | 12/1996 | King |
| 5,610,754 | A | 3/1997 | Gheen |
| 5,668,587 | A | 9/1997 | Hammond |
| 5,705,788 | A | 1/1998 | Beyer |
| 5,838,024 | A | 11/1998 | Masuda |
| 5,840,451 | A | 11/1998 | Moore |
| 6,037,965 | A | 3/2000 | Gross |
| 6,133,986 | A | 10/2000 | Johnson |
| 6,204,875 | B1 | 3/2001 | De Loor |
| 6,268,613 | B1 | 7/2001 | Cantu |
| 6,310,710 | B1 | 10/2001 | Shahar |
| 6,313,862 | B1 | 11/2001 | Berner |
| 6,466,352 | B1 | 10/2002 | Shahar |
| 6,531,681 | B1 | 3/2003 | Markle |
| 6,559,438 | B1 | 5/2003 | Drobot |
| 6,683,727 | B1 | 1/2004 | Goring |
| 6,765,647 | B1 | 7/2004 | Nishi |
| 6,795,169 | B2 | 9/2004 | Tanaka |
| 6,967,711 | B2 | 11/2005 | Gui |
| 7,116,402 | B2 | 10/2006 | Gui |
| 7,202,939 | B2 | 4/2007 | Gui et al. |
| 7,239,373 | B2 | 7/2007 | Tinnemans et al. |
| 7,317,510 | B2 | 1/2008 | Bontekoe et al. |
| 7,403,265 | B2 | 7/2008 | Tinnemans et al. |
| 7,969,636 | B2 | 6/2011 | Naito |
| 8,531,648 | B2 | 9/2013 | De Jager et al. |
| 8,896,808 | B2 | 11/2014 | Tinnemans |
| 2002/0115021 | A1 | 8/2002 | Piao |
| 2002/0126479 | A1 | 9/2002 | Zhai |
| 2002/0171047 | A1 | 11/2002 | Chan |
| 2003/0043582 | A1 | 3/2003 | Chan |
| 2003/0091277 | A1 | 5/2003 | Mei |
| 2004/0124372 | A1 | 7/2004 | Gil |
| 2004/0135159 | A1 | 7/2004 | Siegel |
| 2004/0257629 | A1 | 12/2004 | Noehte |
| 2005/0167508 | A1 | 8/2005 | Syms |
| 2005/0200821 | A1* | 9/2005 | Gui .................... G03F 7/70291 355/67 |
| 2006/0001855 | A1 | 1/2006 | Lof |
| 2006/0103719 | A1 | 5/2006 | Katzir |
| 2006/0108508 | A1 | 5/2006 | Khalid |
| 2006/0132750 | A1 | 6/2006 | Gui et al. |
| 2006/0139600 | A1* | 6/2006 | Jacobus Tinnemans ............... G03F 7/70275 355/67 |
| 2006/0139980 | A1 | 6/2006 | Bontekoe et al. |
| 2006/0221322 | A1 | 10/2006 | Tinnemans et al. |
| 2007/0030470 | A1 | 2/2007 | Tinnemans et al. |
| 2007/0034890 | A1 | 2/2007 | Daschner |
| 2007/0182808 | A1 | 8/2007 | Stiblert |
| 2007/0296936 | A1 | 12/2007 | Kato |
| 2007/0296942 | A1 | 12/2007 | Tinnemans |
| 2008/0042969 | A1 | 2/2008 | Baker |
| 2008/0047445 | A1 | 2/2008 | Berner |
| 2008/0137051 | A1 | 6/2008 | Maly |
| 2008/0160211 | A1 | 7/2008 | Siegel |
| 2008/0210888 | A1 | 9/2008 | Inoue |
| 2008/0239267 | A1 | 10/2008 | Suzuki et al. |
| 2009/0226631 | A1* | 9/2009 | Yamazaki ............... H05B 33/10 427/510 |
| 2009/0296063 | A1 | 12/2009 | Opower |
| 2010/0142757 | A1 | 6/2010 | Sandstrom |
| 2010/0265557 | A1 | 10/2010 | Sallander |
| 2011/0051211 | A1 | 3/2011 | Walther |
| 2011/0188016 | A1 | 8/2011 | De Jager |
| 2014/0071421 | A1 | 3/2014 | De Jager et al. |

FOREIGN PATENT DOCUMENTS

| | | |
|---|---|---|
| CN | 102109775 | 6/2011 |
| CN | 102203674 | 9/2011 |
| DE | 4315580 | 11/1994 |
| DE | 4315581 | 11/1994 |
| DE | 19813127 | 10/1998 |
| EP | 1 674 934 | 6/2006 |
| EP | 1 708 030 | 10/2006 |
| EP | 1 835 347 | 9/2007 |
| JP | 57-152273 | 9/1982 |
| JP | 06-275936 | 9/1994 |
| JP | 2003-220484 | 8/2003 |
| JP | 2006-186371 | 7/2006 |
| JP | 2006-285243 | 10/2006 |
| JP | 2008-047873 | 2/2008 |
| JP | 2010-114266 | 5/2010 |
| TW | 200627084 | 8/2006 |
| TW | 200705109 | 2/2007 |
| TW | 201015244 | 4/2010 |
| WO | 97/34171 | 9/1997 |
| WO | 98/33096 | 7/1998 |
| WO | 98/38597 | 9/1998 |
| WO | 2005/006082 | 1/2005 |
| WO | 2006/002668 | 1/2006 |
| WO | 2006/064363 | 6/2006 |
| WO | 2007/050022 | 5/2007 |
| WO | 2007/050023 | 5/2007 |
| WO | 2007/098935 | 9/2007 |
| WO | 2008/071347 | 6/2008 |
| WO | 2010/032224 | 3/2010 |
| WO | 2010/151123 | 12/2010 |
| WO | 2011/026610 | 3/2011 |
| WO | 2011/104174 | 9/2011 |
| WO | 2013/023874 | 2/2013 |

OTHER PUBLICATIONS

International Preliminary Report on Patentability mailed Jun. 12, 2014 in corresponding International Patent Application No. PCT/EP2012/071927.
LOT-Oriel Group Europe, "MicroWriter™ Laser Lithography System," www.LOT-Oriel.com (2 pp, date unknown, obtained Jul. 2010).
"Large-Plate Exposure System FX-63S," Nikon Web Magazine: Nikon Technology Outlook, Sep. 24, 2004, pp. 1-4.
JetScreen DX Flat Brochure (6 pp., date unknown, obtained Feb. 2009).
"Lithographic Apparatus and Device Manufacturing Method," Research Disclosure, Mason Publications, Hampshire, GB, vol. 551, No. 29. Mar. 1, 2010, p. 322, XP007139689, ISSN: 0374-4353.
International Search Report mailed Apr. 9, 2013 in corresponding International Patent Application No. PCT/EP2012/071927.
Japanese Office Action dated May 19, 2015 in corresponding Japanese Patent Application No. 2014-542758, (56) References Cited

OTHER PUBLICATIONS

Korean Office Action mailed Sep. 25, 2015 in corresponding Korean Patent Application No. 10-2014-7015386.
Chinese Office Action dated May 5, 2015 in corresponding Chinese Patent Application No. 201280057705.6.
Chinese Office Action dated Jun. 15, 2016 in corresponding Chinese Patent Application No. 201280057705.

* cited by examiner

LITHOGRAPHIC APPARATUS, DEVICE MANUFACTURING METHOD AND COMPUTER PROGRAM

CROSS-REFERENCE TO RELATED APPLICATIONS

This application is the US national phase entry of PCT patent application no. PCT/EP2012/071927, which was filed on Nov. 6, 2012, which claims the benefit of priority of U.S. provisional application No. 61/564,642, which was filed on Nov. 29, 2011, and which is incorporated herein in its entirety by reference.

FIELD

The present invention relates to an exposure apparatus, a lithographic apparatus, a method for manufacturing a device and a computer program.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate. In a similar regard, an exposure apparatus is a machine that use a radiation beam in forming a desired pattern on or in a substrate (or a part thereof).

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices and the like. A programmable patterning device could also be formed from an electro-optical deflector, configured for example to move spots of radiation projected onto the substrate or to intermittently direct a radiation beam away from the substrate, for example to a radiation beam absorber. In either such arrangement, the radiation beam may be continuous.

SUMMARY

In a lithographic or exposure process, a plurality of radiation beams may be created, patterned and projected onto a substrate. The beams may not have well-defined boundaries and overlap to a varying extent. In one example, an array of self-emissive contrast devices may be used in order to generate the radiation beams, as identified above. However, although each of the self-emissive contrast devices may be designed to provide a radiation beam of nominal profile, there will likely be some variation in the profile of the radiation beam provided by each of the self-emissive contrast devices. This may result, for example, from manufacturing tolerances and/or environmental factors affecting the performance of the self-emissive contrast device in use. The self-emissive contrast devices may, for example, be laser diodes.

Variation of the profiles of the beams of radiation projected onto the substrate is undesirable. In particular, variation in beam profile affects the interactions between adjacent imaging points, in effect cross-talk or coupling between beams. To address this, the interactions of individual beams when imaging may be adjusted to take account of the influence of neighboring spots. A (de)-convolution kernel for each beam is used to calculate the interaction. It is therefore desirable to provide, for example, a lithographic or exposure system in which one or more problems introduced by deviations of the profile of one or more of the radiation beams from a nominal profile can be mitigated or minimized.

According to an embodiment of the invention, there is provided an exposure apparatus, comprising: a radiation source configured to produce a plurality of radiation beams having individually controllable intensities; a projection system configured to project each of the radiation beams onto a respective location on a target; and a controller configured to calculate a target intensity value for each of the radiation beams to expose the target to a desired pattern and to control the radiation source to emit beams with the target intensity values, wherein the controller calculates the target intensity values with reference to the position and/or rotation of each of the locations relative to the projection system.

According to an embodiment of the invention, there is provided a device manufacturing method in which a target is to be irradiated with a desired pattern, the method comprising: calculating an intensity value for each of a plurality of radiation beams to be used to irradiate the target, the calculation being performed with reference to a position and/or rotation relative to a projection system of a plurality of locations on the target; and projecting the radiation beams having the calculated intensity values onto respective ones of the locations using the projection system.

According to the embodiment of the invention, there is provided a computer program to calculate an intensity value for each of a plurality of radiation beams to be used to irradiate a target, the computer program comprising code to instruct a processor to perform the calculation with reference to a position and/or rotation relative to a projection system of each of a plurality of locations on the target.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to an apparatus that may include a programmable patterning device that may, for example, be comprised of an array or arrays of self-emissive contrast devices. Further information regarding such an apparatus may be found in PCT patent application publication no. WO 2010/032224 A2, U.S. patent application publication no. US 2011-0188016, U.S. patent application No. 61/473,636 and U.S. patent application No. 61/524,190 which are hereby incorporated by reference in their entireties. An embodiment of the present invention, however, may be used with any form of programmable patterning device including, for example, those discussed above.

Figure 1:
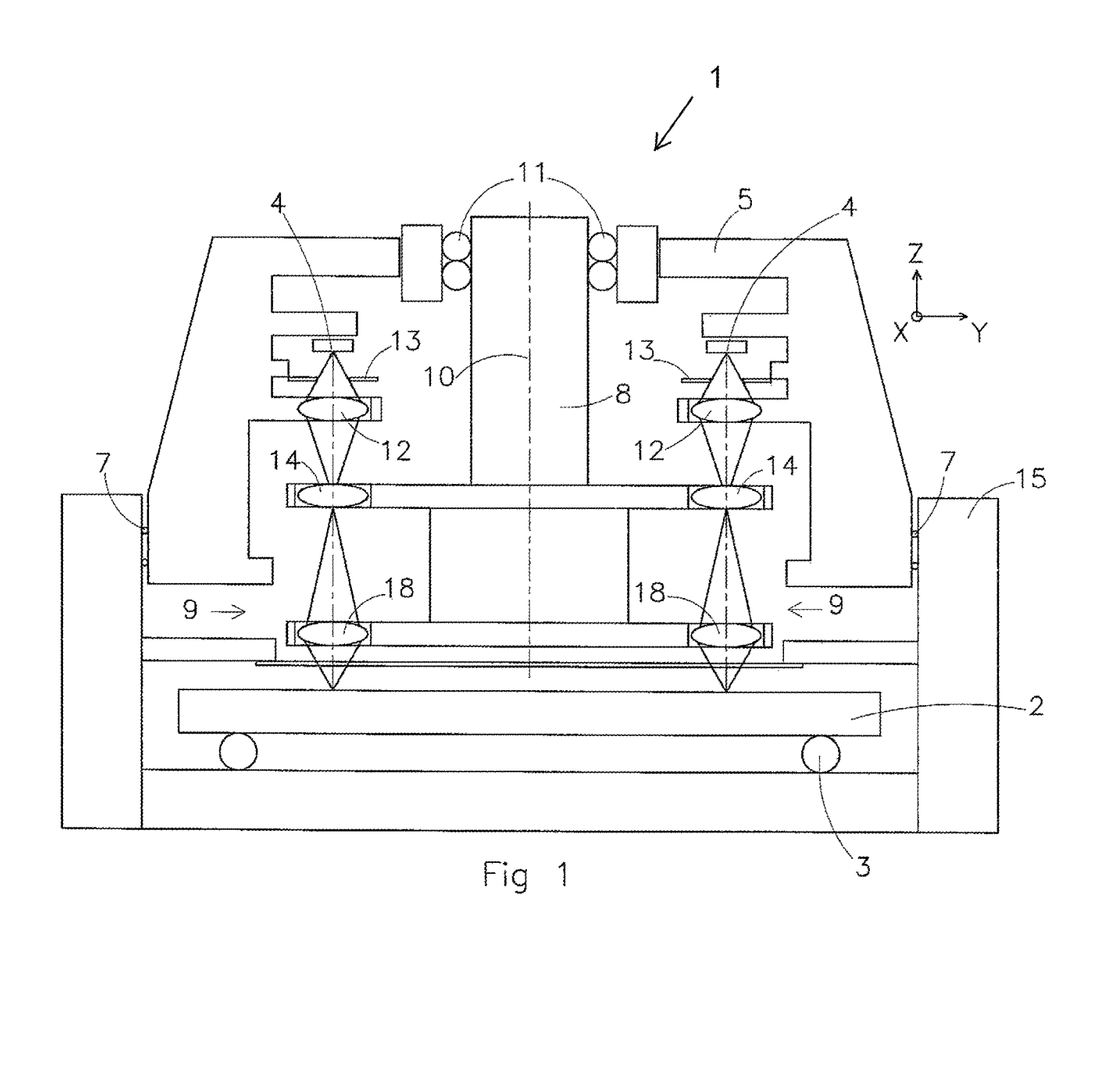
FIG. 1 depicts a part of a lithographic or exposure apparatus according to an embodiment of the invention.

FIG. 1 schematically depicts a schematic cross-sectional side view of a part of a lithographic or exposure apparatus. In this embodiment, the apparatus has individually controllable elements substantially stationary in the X-Y plane as discussed further below although it need not be the case. The apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the apparatus is suitable for roll-to-roll manufacturing.

The apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr).

Figure 2:
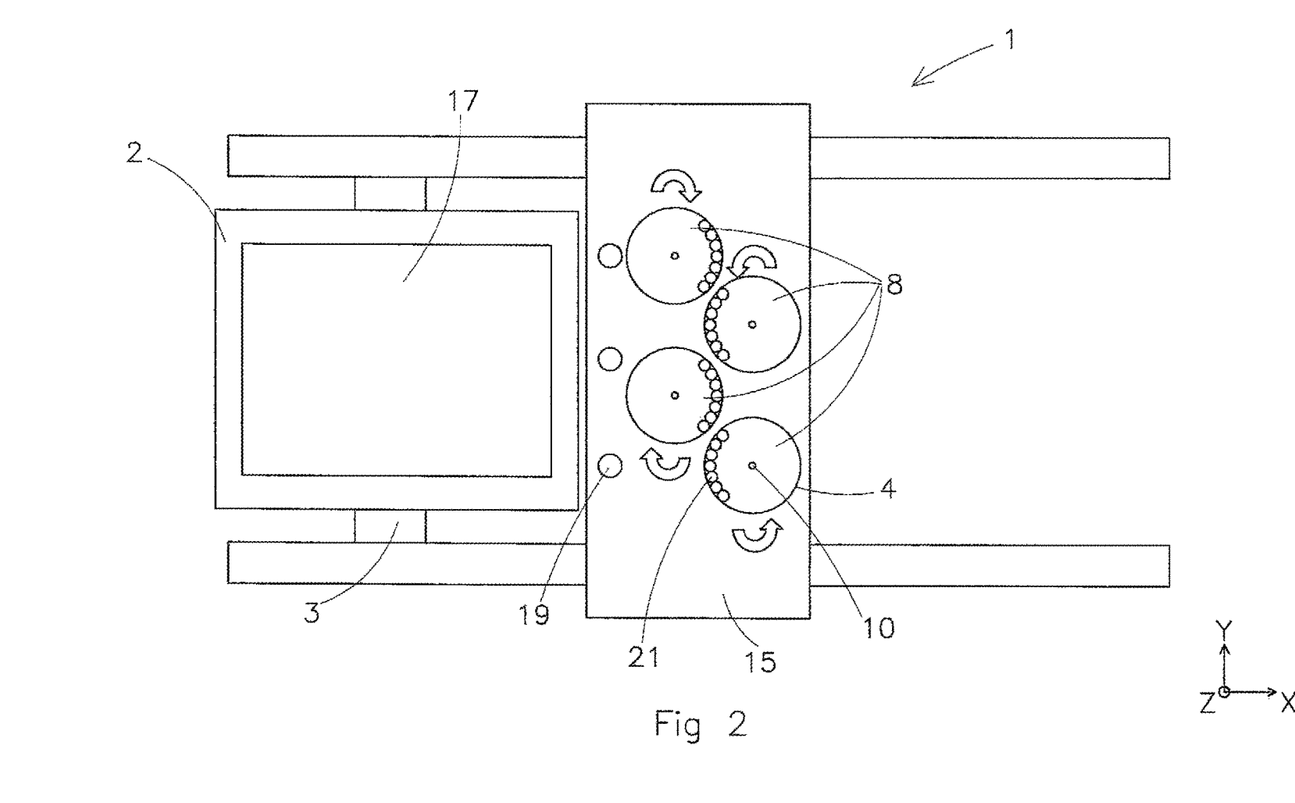
FIG. 2 depicts a top view of a part of the lithographic or exposure apparatus of FIG. 1 according to an embodiment of the invention.

The self-emissive contrast devices 4 are arranged on a frame 5 and may extend along the Y-direction and/or the X direction. While one frame 5 is shown, the apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The apparatus 1 may comprise an actuator (e.g. motor) 11 to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator (e.g. motor) 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the apparatus of FIG. 1 having self-emissive contrast devices 4. Like the apparatus 1 shown in FIG. 1, the apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
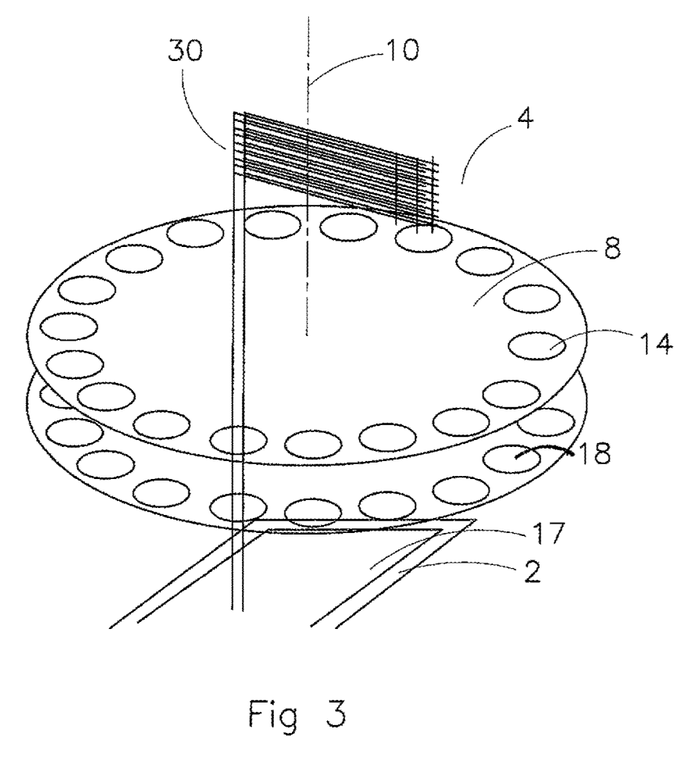
FIG. 3 depicts a highly schematic, perspective view of a part of a lithographic or exposure apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
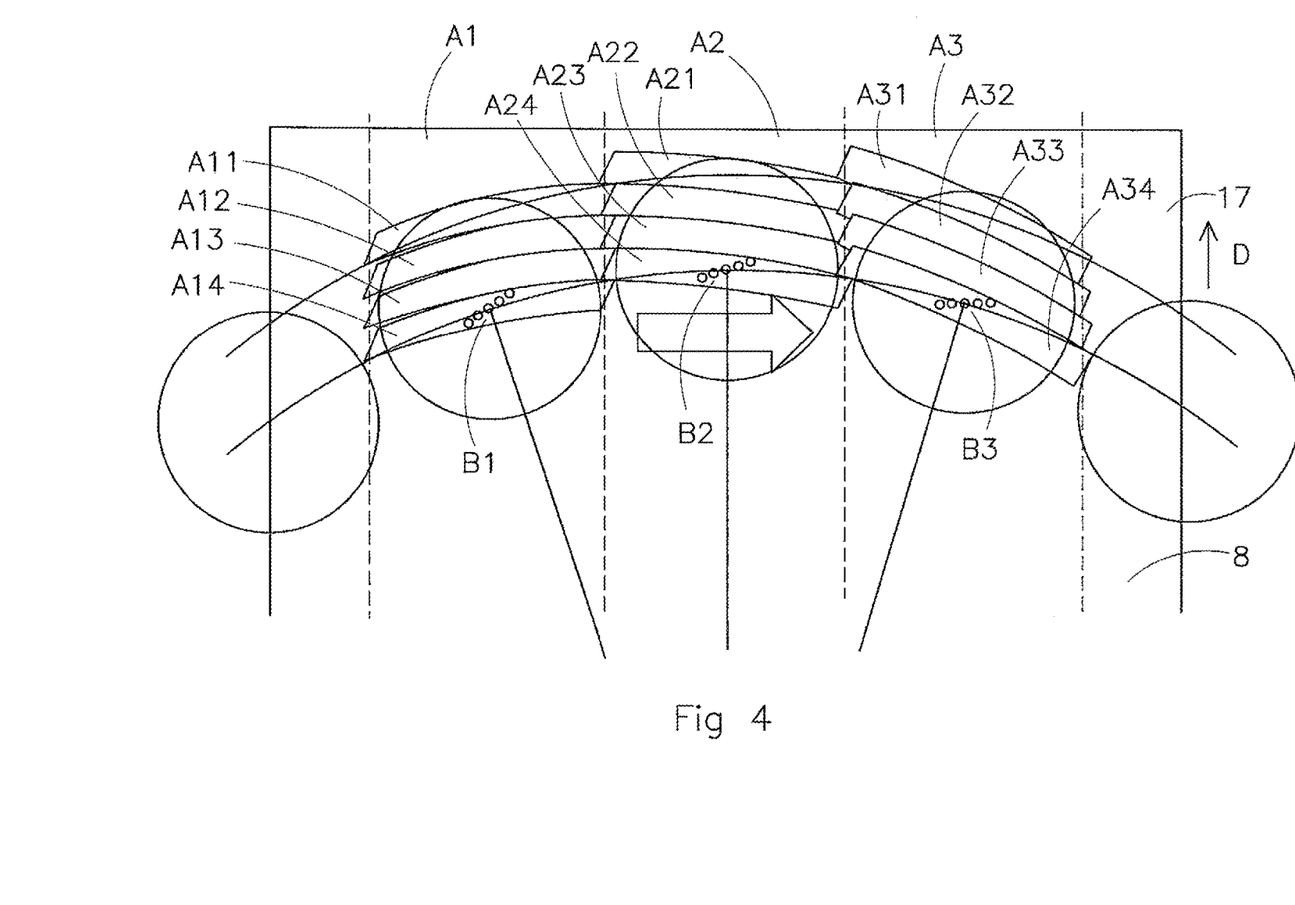
FIG. 4 depicts a schematic top view of projections by the lithographic or exposure apparatus according to FIG. 3 onto a substrate according to an embodiment of the invention.

As the rotatable frame rotates, the beams are incident on successive lenses and, each time a lens is irradiated by the beams, the places where the beam is incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2), thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, areas A21, A22, A23 and A24 (areas A21, A22, A23 being previously scanned and A24 being currently scanned as shown in FIG. 4) for beams B2 and areas A31, A32, A33 and A34 (areas A31, A32, A33 being previously scanned and A34 being currently scanned as shown in FIG. 4) for beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided to control the focus of an image projected onto a substrate. The arrangement may be provided to adjust the focus of the image projected by part or all of an optical column in an arrangement as discussed above.

In an embodiment the projection system projects the at least one radiation beam onto a substrate formed from a layer of material above the substrate 17 on which a device is to be formed so as to cause local deposition of droplets of the material (e.g. metal) by a laser induced material transfer.

Figure 5:
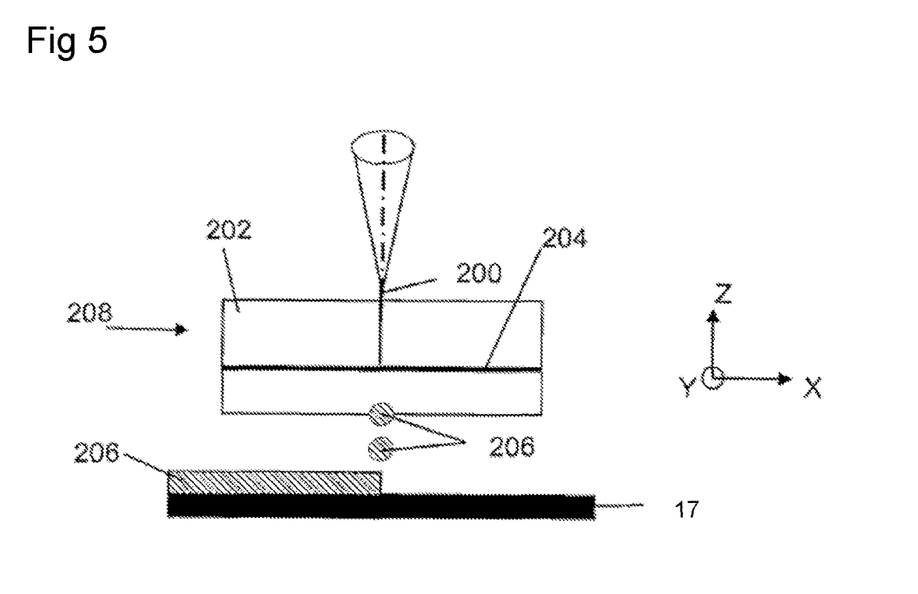
FIG. 5 depicts, in cross-section, a part of an embodiment of the invention.

Referring to FIG. 5, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a substrate formed from a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 17 on which a device is to be formed. By pointing the beam 200 on the appropriate position on the donor plate 208, a donor material pattern can be deposited on the substrate 17. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum, a temperature of about 900 to 1000 degrees Celsius is desirable.

In an embodiment, through the use of a laser pulse, an amount of material (e.g., metal) is transferred from the donor structure 208 to the substrate 17 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

Figure 6:
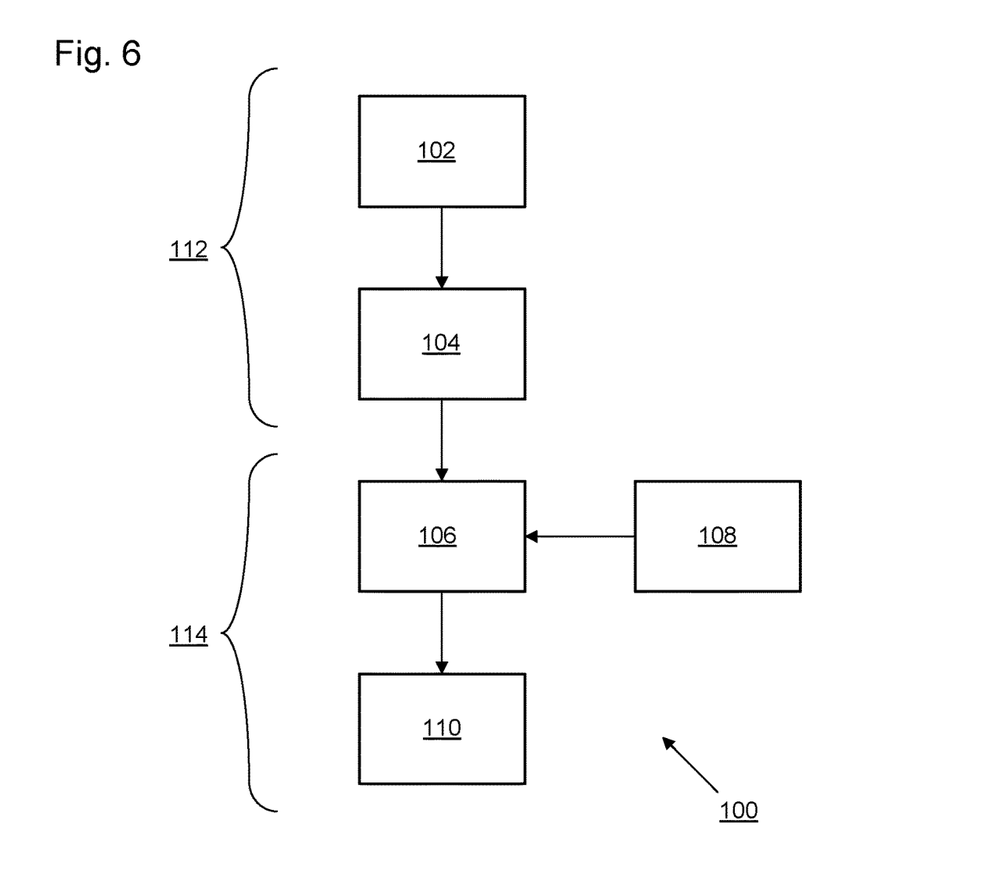
FIG. 6 depicts a portion of a data-path for converting a vector-based representation of a desired device pattern to a control signal.

Hardware and/or software constituting a "data-path" may be provided to convert a vector-based representation of a desired device pattern to be formed on a substrate to a control signal suitable for driving a programmable patterning device. FIG. 6 is a schematic illustration showing example processing stages 100 that may be included in such a data-path. In an embodiment each of the stages is connected directly to its neighboring stages. However, this need not be the case. In an embodiment one or more additional processing stages may be provided in between any of the stages shown. Additionally or alternative, each of one or more of the stages may comprise multiple stages. One or more of the stages may be combined.

In the example shown in FIG. 6 a vector-based representation of a desired device pattern is provided in stage 102. The vector-based representation may be constructed using a vector design package such as GDSII. The stored vector-based representation is forwarded to a rasterization stage 104, either directly or via one or more intermediate stages. Examples of intermediate stages include a vector pre-processing stage and a low-pass filter stage. The low-pass filter stage may perform anti-aliasing processing for example.

The rasterization stage 104 converts the vector-based representation (or a processed version of the vector-based representation) of the desired device pattern to a rasterized representation of a desired dose pattern that corresponds to the desired device pattern (i.e. is suitable for forming the desired device pattern by post-exposure processing of the substrate). The rasterized representation may comprise bitmap data, for example. The bitmap data may be referred to as "pixelmap" data. The bitmap data may comprise a set of values indicating the desired dose at each point on a grid of points. The grid of points may be referred to as a rasterization grid.

The rasterized representation (as output from the rasterization stage 104 directly or after further processing) may be supplied to a control signal generation stage 106. The control signal generation stage 106 may be implemented as a single stage (as shown) or as a plurality of separate stages.

The control signal generation stage 106 may perform a mapping operation between the rasterization grid and the grid (which may be referred to as the "spot exposure grid") defining the locations at which the patterning device can form spot exposures at the target (e.g., substrate) level. The mapping operation may comprise interpolation between the rasterization grid and the spot exposure grid. The mapping operation may be configured to receive metrology data from a metrology data storage stage 108. The metrology data may specify, for example, the position and/or orientation of the mounted substrate, and/or a previously formed device pattern on the mounted substrate, relative to the patterning device. The metrology data may also specify measured distortions of a mounted substrate or previously formed device pattern. The distortions may include shift, rotation, skew and/or magnification, for example. The metrology data therefore provides information about how the interpolation between the rasterization grid and the spot exposure grid should be carried out in order to ensure proper positioning of the desired dose pattern on the target.

The control signal generation stage 106 may calculate a set of intensities to be applied at each position in the spot exposure grid to form the desired dose pattern. The set of intensities may define, for each position in the grid, the intensity of the radiation beam that is to be used to generate the spot at that position, for example. This calculation may account for the properties of the optical projection system and may therefore be referred to as an "inverse-optics" calculation. The calculation may account for the sizes and/or shapes of individual spots, for example, which may be dictated by properties of the optical projection system. The size and/or shape may be defined for each of a given set of possible applied intensities for the spot. The spot size and/or shape may define the variation with position of the applied dose for a given spot for example. The calculation may also take into account deviations in the positions of the spots from nominal positions defined by the ideal (i.e. engineering error free) spot exposure grid geometry.

The spots may overlap with each other at target level so that the final dose achieved at a reference position in the spot exposure grid may depend on the applied intensities at a number of neighboring spots. This effect may be modelled mathematically by a convolution operation. The control signal generation stage 106 needs to perform the reverse process (determine the intensities that need to be applied at each position for a given desired dose pattern), so a deconvolution operation may be performed. The deconvolution operation may be defined by a deconvolution kernel. The deconvolution kernel may be represented by a deconvolution matrix. The coefficients of such a deconvolution matrix may be interpreted as weights that define the extent to which the dose at points in the region of a reference point in the desired dose pattern need to be taken into account when calculating the intensity to be applied at the corresponding point (or spot) in the spot exposure grid.

Figure 7:
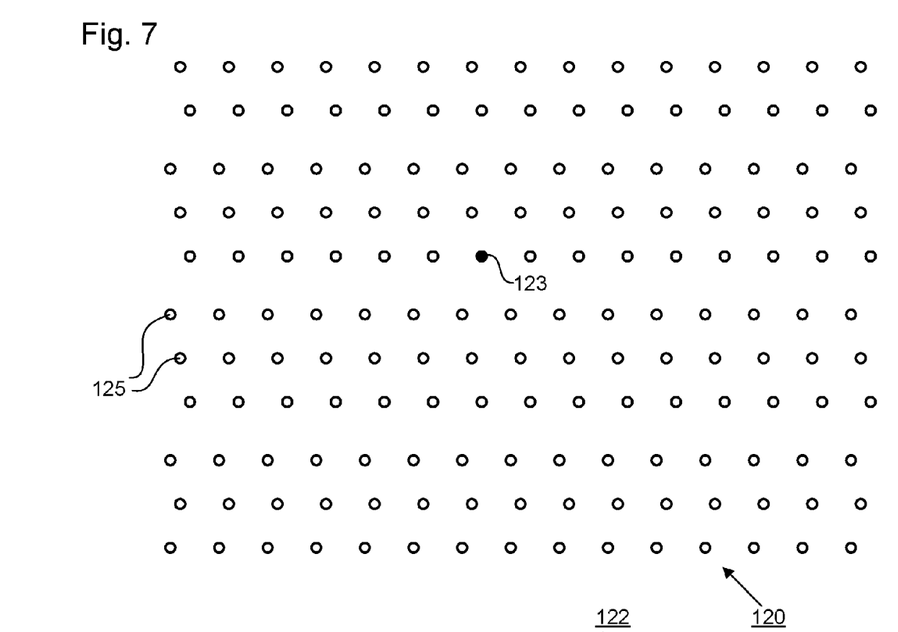
FIG. 7 depicts a portion of a spot exposure grid.
Figure 8:
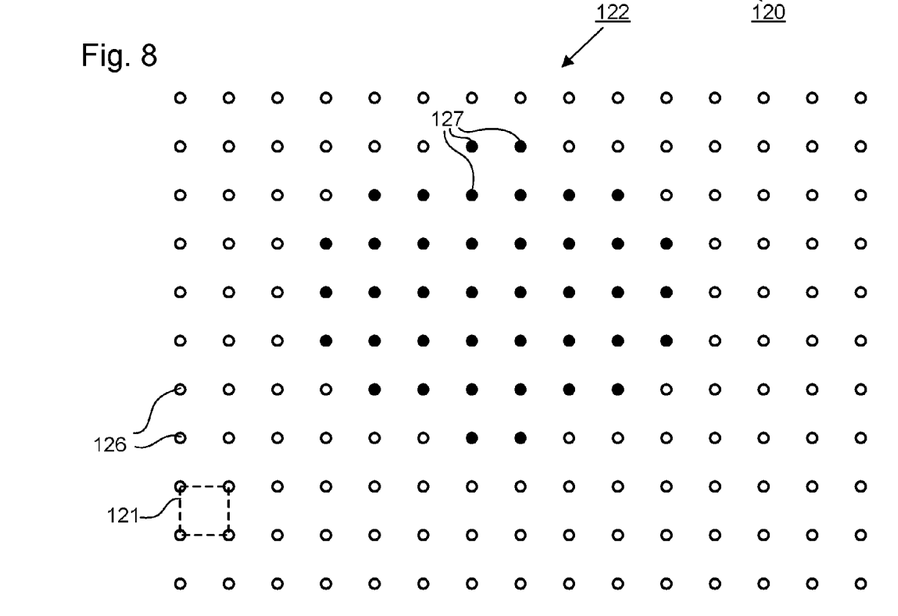
FIG. 8 depicts a portion of a rasterization grid.

FIGS. 7 and 8 illustrate schematically a step in such a deconvolution operation.

FIG. 7 illustrates a portion of an example spot exposure grid 120. Each point 125 in the grid 120 represents the center of a spot that will be formed by the patterning device on the target. The deconvolution operation aims to determine the intensity value to apply at each of the points 125. The spot exposure grid 120 will have a geometry that corresponds to the pattern of spot exposures that the patterning device is able to form on the target. The geometry of the spot exposure grid may therefore be irregular. In an irregular grid, within the meaning of the present application, the density of grid points varies as a function of position so that it is not possible to construct the grid completely by tessellating a single unit cell that contains a single grid point only. The geometry of the grid 120 that is illustrated in FIG. 7 is greatly simplified and does not necessarily resemble a spot exposure grid associated with a commercial device.

FIG. 8 illustrates an example portion of a rasterization grid 122. In this example the rasterization grid 122 has a regular geometry. In this example the regular geometry is rectangular. The density of grid points of a regular grid, within the meaning of the present application, is "uniform" in the sense that the grid can be completely formed by tessellating a single type of unit cell that comprises a single grid point only. Dotted line 121 illustrates an example unit cell. The dotted line intersects a quarter of four grid points and therefore contains one grid point in total. A sample of the desired dose pattern may be provided at each of the points 126 in the grid 122.

The solid grid point 123 in FIG. 7 represents a reference grid point (chosen at random). Application of the deconvolution operation for deriving the intensity to be applied at the solid grid point 123 will involve weighted contributions of the samples of the desired dose pattern at a plurality of grid points in the spot exposure grid in the region of the spot exposure grid corresponding to the position of the reference grid point 123. The solid grid points 127 in FIG. 8 represent schematically the grid points that may be involved with such a deconvolution operation. In an embodiment, a deconvolution kernel expressed as a matrix will define which grid points 126 are involved (by the positions of the non-zero coefficients in the matrix) and the extent to which the grid points are involved (by the values of the non-zero coefficients in the matrix).

The nature of the deconvolution operation may be different for different points in the spot exposure grid and/or between points. This variation may take into account variations in the optical performance of the patterning device for example. The variations in optical performance may be obtained using calibration measurements. In an embodiment a library of deconvolution kernels, optionally obtained from calibration measurements, may be stored and accessed as needed.

The control signal generation stage 106 may convert the sequence of intensity values to be applied at each of the points in the spot exposure grid to setpoint values in order the generate the control signal. The setpoint values may take into account the nature of the patterning device. For example, where the patterning device comprises a plurality of self-emissive contrast devices, the setpoint values may account for non-linearity in the response of the self-emissive contrast devices. The setpoint values may take into account variations in the properties of nominally identical contrast devices by calibration measurements for example.

A control signal output stage 110 receives the control signal from the control signal generation stage and supplies the signal to the patterning device.

In the example shown, stages 102 and 104 are performed in an offline part 112 of the data-path and stages 106-110 are performed in an online part 114 of the data-path. However, this is not essential. In an embodiment all or a portion of the functionality associated with stage 104 could be carried out online. Alternatively or additionally, all or a portion of the functionality of stages 106 and/or 108 could be carried out offline.

FIG. 7 above illustrates the spot exposure grid 120 at a single plane, e.g. a nominal plane of best focus. In that plane, the positions of the grid points vary from an ideal uniform grid for a variety of reasons. Each grid point represents a nominal location of a beam on the target. It may also be necessary to take into account position in the Z direction, that is perpendicular to the nominal plane of best focus and parallel to the optical axis of the projection system. In general, for example, the substrate which is to be patterned is not flat, e.g. due to deformation of the substrate or structures formed thereon in earlier processing steps. Thus, for example, when the target (e.g., substrate) is positioned optimally relative to the plane of best focus at the locations where some of the beams are incident on the target, the target surface will not lie exactly in the plane of best focus.

In cases where the target (e.g., substrate) surface is not in the plane of best focus at the location of incidence of a projection beam, additional errors can occur. It is believed these errors are due to telecentricity of the projection beams and/or changes in the projection beam profile in the Z direction (focus). The effect of telecentricity and variation of the beam profile in the Z direction is that the effective spot positions and the effect of one beam on imaging at another grid position vary with position of the target in the Z direction. Therefore, according to an embodiment of the present invention, in calculating beam intensities for projecting a plurality of spots on a target, account is taken of the position in the Z direction and/or rotation (tilt) of the target at the locations of incidence of the beams. It is estimated that an embodiment of the invention can reduce line edge roughness by about 50%.

Figure 9:
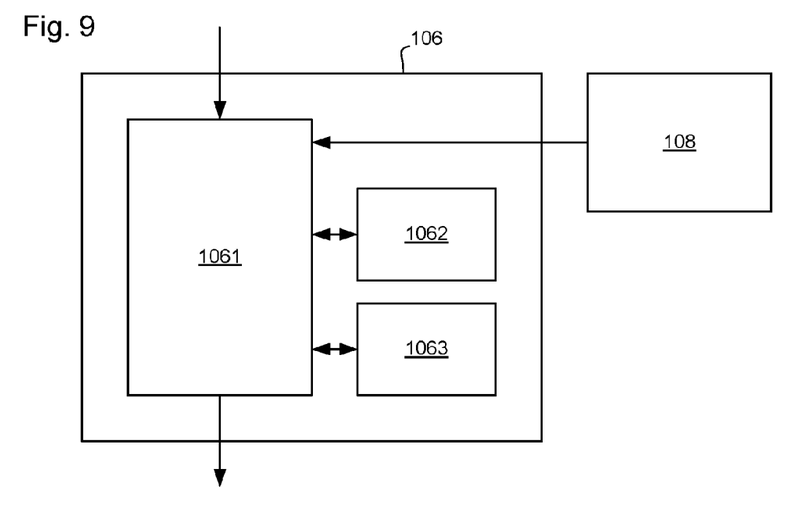
FIG. 9 depicts a part of a data path in an embodiment of an invention.

In an embodiment of the invention, referring to FIG. 9, the control signal generation stage 106 comprises a processor unit 1061 coupled to a first memory 1062 which stores information, e.g. set points, representing a trajectory of the target (e.g., substrate) relative to the projection system for exposure of a pattern. The processor 1061 is also connected to a second memory 1063 which stores a plurality of deconvolution kernels for each grid point 126. The plurality of deconvolution kernels are each associated with a Z position and/or rotation. In an embodiment, the plurality of deconvolution kernels are associated with Z positions that span and sample a range of about 10 µm. When performing the deconvolution operation to determine the intensity value to apply at each of the points 125, the processor 1061 consults the metrology data from metrology data storage stage 108 and the trajectory information stored in first memory 1062 and determines the expected Z position and/or rotation of the location on the substrate corresponding to the grid point 125 at the expected time of the exposure. The calculated or predicted Z position and/or rotation is then used to select an appropriate one of the deconvolution kernels stored in second memory 1063.

In an embodiment, second memory 1063 is structured as a look-up table with the calculated Z position and/or rotation being used to select the appropriate deconvolution kernel. In an embodiment, in the event that the calculated Z position and/or rotation does not correspond exactly to the Z position and/or rotation of one of the stored deconvolution kernels, a deconvolution kernel is calculated from the stored deconvolution kernels by interpolation or extrapolation. Having selected or calculated a suitable deconvolution kernel for each grid point 125, the deconvolution calculation proceeds as above. The angle of the substrate about directions perpendicular to the Z axis can also be taken into account, e.g. in the calculation of a kernel based on the stored kernels.

In an embodiment, a 3-dimensional deconvolution calculation is carried out for the volume defined by the area to be exposed at one time and the Z-position range covered by the deconvolution kernels. The 3-dimensional calculation is effectively a 2-dimensional calculation at each of a plurality of steps in the Z direction. Having carried out the 3-dimensional calculation, the spot intensities are obtained by selecting from the plurality of calculated values the appropriate ones for the expected Z positions at each grid position.

Figure 10:
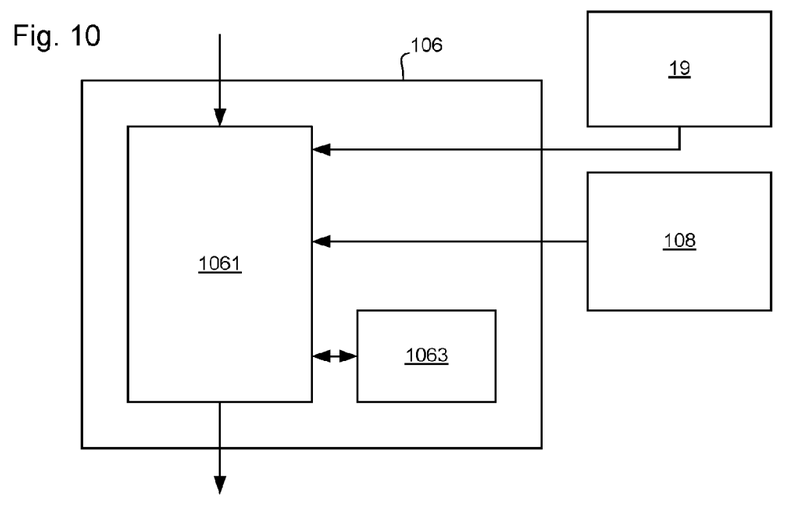
FIG. 10 depicts a part of a data path in an embodiment of the invention.

In the above embodiment, the calculation of beam intensities is performed in advance of the exposure. In an embodiment of the invention, illustrated in FIG. 10, the deconvolution calculation is carried out "on-the-fly", that is while the exposures are being performed. In this embodiment, which is otherwise the same as the embodiment described above, the first memory 1062 storing information of the target trajectory is omitted. Instead, data from alignment/level sensor 19 is used to provide a real-time measurement of the position in the Z direction and/or rotation of the target. This is then used to select or determine the appropriate deconvolution kernel based on the library of deconvolution kernels stored in second memory 1063. In an embodiment, alignment/level sensor 19 provides Z position and/or rotation information at a limited number of locations on the target, e.g. three, and the metrology information defining the contour of the target and stored in metrology database 108 is used to calculate the Z position and/or rotation at the locations corresponding to the relevant grid points based on the data from alignment/level sensor 19.

In embodiment, deconvolution kernels for the different Z positions and/or rotations are obtained by a calibration procedure. For example, an image of the beam is taken at different Z positions, e.g. the nominal plane of best focus and five steps above and below it, using an imaging device such as a CCD. The deconvolution kernels can be calculated from such images. The number of calculated deconvolution kernels can be greater than the number of measurements taken.

In accordance with a device manufacturing method, a device, such as a display, integrated circuit or any other item may be manufactured from the substrate on which the pattern has been projected.

Although specific reference may be made in this text to the use of lithographic or exposure apparatus in the manufacture of ICs, it should be understood that the lithographic or exposure apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media.

The descriptions above are intended to be illustrative, not limiting. Thus, it will be apparent to one skilled in the art that modifications may be made to the invention as described without departing from the scope of the claims set out below.

The invention claimed is:

1. An exposure apparatus, comprising:
a radiation source configured to produce a plurality of radiation beams having individually controllable intensities;
a projection system configured to project each of the radiation beams onto a respective location on a target; and
a controller configured to calculate a target intensity value for each of the radiation beams to expose the target to a desired pattern and to control the radiation source to emit beams with the target intensity values, wherein the controller calculates the target intensity values using a calculated or measured value of the position and/or rotation of each of the locations relative to the projection system and the controller calculates the target intensity values using a function for each radiation beam that models radiation coupling to that beam from a neighboring beam.

2. The apparatus according to claim 1, wherein the function depends on the position and/or rotation of each of the locations relative to the projection system.

3. The apparatus according to claim 2, wherein the controller comprises a look-up table that stores a plurality of functions for each radiation beam, the controller configured to select a function for each radiation beam from the look-up table according to the calculated or measured value of the position and/or rotation of the respective location.

4. The apparatus according to claim 1, wherein the function is a convolution or deconvolution kernel.

5. The apparatus according to claim 1, further comprising a position sensor configured to measure the position and/or rotation of the locations on the target relative to the projection system while the radiation beams are being projected onto the target.

6. The apparatus according to claim 1, further comprising:
a first memory arranged to store data representing a map of a surface profile of the target;
a second memory arranged to store data representing a trajectory of the target; and
a position calculator arranged to calculate a position and/or rotation of each location from the map and the trajectory.

7. The apparatus according to claim 1, wherein the controller calculates the target intensity values using a calculated or measured value of the positions of the locations relative to the projection system and the positions of the locations relative to the projection system are distances from a reference plane in a direction perpendicular to the reference plane.

8. The apparatus according to claim 1, wherein the target is a target portion on a substrate.

9. The apparatus according to claim 1, wherein the target is a layer of donor material spaced apart from a substrate on which a device is to be formed.

10. The apparatus according to claim 1, wherein the radiation source comprises a programmable patterning device configured to provide the plurality of radiation beams.

11. The apparatus according to claim 10, wherein the programmable patterning device comprises a controllable element to selectively provide the beams of radiation.

12. The apparatus according to claim 10, wherein the programmable patterning device comprises a plurality of self-emissive contrast devices.

13. A device manufacturing method in which a target is to be irradiated with a desired pattern, the method comprising:
calculating an intensity value for each of a plurality of radiation beams to be used to irradiate the target, the calculation being performed based on a calculated or measured value of a position and/or rotation relative to a projection system of a plurality of locations on the target and the calculation using a function for each radiation beam that models radiation coupling to that beam from a neighboring beam; and
projecting the radiation beams having the calculated intensity values onto respective ones of the locations using the projection system.

14. The method according to claim 13, wherein the function depends on the position and/or rotation of each of the locations relative to the projection system.

15. The method according to claim 14, comprising selecting the function for each radiation beam from a look-up table according to the calculated or measured value of the position and/or rotation of the respective location, the look-up table storing a plurality of functions for each radiation beam.

16. A non-transitory data storage medium comprising a computer program stored therein to calculate an intensity value for each of a plurality of radiation beams to be used to irradiate a target, the computer program comprising code to instruct a processor to perform the calculation using a calculated or measured value of a position and/or rotation relative to a projection system of each of a plurality of locations on the target and to perform the calculation using a function for each radiation beam that models radiation coupling to that beam from a neighboring beam.

17. The storage medium according to claim 16, wherein the function is a convolution or deconvolution kernel.

18. The storage medium according to claim 16, wherein the function depends on the position and/or rotation of each of the locations relative to the projection system.

19. The storage medium according to claim 16, further comprising code configured to calculate a position and/or rotation of each location from a map of a surface profile of the target and data representing a trajectory of the target.

20. The storage medium according to claim 16, wherein the code is configured to perform the calculation using a calculated or measured value of the positions of the locations relative to the projection system and the positions of the locations relative to the projection system are distances from a reference plane in a direction perpendicular to the reference plane.

* * * * *